(12) United States Patent  
Liu

(10) Patent No.: US 7,592,577 B1  
(45) Date of Patent: Sep. 22, 2009

(54) SELF-TRIGGERING CMOS IMAGING ARRAY UTILIZING GUARD REGION STRUCTURES AS LIGHT DETECTORS

(75) Inventor: XinQiao Liu, Mountain View, CA (US)

(73) Assignee: Fairchild Imaging, Inc., Milpitas, CA (US)

( * ) Notice: Subject to any disclaimer, the term of this patent is extended or adjusted under 35 U.S.C. 154(b) by 0 days.

(21) Appl. No.: 12/111,016

(22) Filed: Apr. 28, 2008

(51) Int. Cl.
*H01L 27/00* (2006.01)
*H01L 31/00* (2006.01)

(52) U.S. Cl. ............ 250/208.1; 250/214.1; 250/370.09; 348/308; 257/297

(58) Field of Classification Search ............... 250/208.1, 250/214.1, 214 R, 370.09; 348/243, 248, 348/297, 308; 257/294, 297, 443
See application file for complete search history.

(56) References Cited

U.S. PATENT DOCUMENTS 5,887,049 A * 3/1999 Fossum ............... 378/98.8

* cited by examiner

*Primary Examiner*—Kevin Pyo
(74) *Attorney, Agent, or Firm*—Calvin B. Ward

(57) ABSTRACT

A camera having an exposure detector is disclosed. The camera includes an array of pixel sensors, CMOS circuitry that is separate from the array of pixel sensors, a guard region, and a current detector. The guard region separates the CMOS circuitry from the array of pixel sensors. The guard region is positioned such that the guard region is exposed to light when the array of pixel sensors is exposed to light. The current detector measures the current flowing from the guard region to a power rail when the guard region is biased to a predetermined potential and generates a start trigger signal when the current exceeds a threshold value. A controller resets the pixel sensors in response to the start trigger signal.

9 Claims, 4 Drawing Sheets

SELF-TRIGGERING CMOS IMAGING ARRAY UTILIZING GUARD REGION STRUCTURES AS LIGHT DETECTORS

BACKGROUND OF THE INVENTION

Solid state image sensors have replaced conventional film for capturing images in cameras. The image sensor typically includes a two-dimensional array of pixels. Each pixel includes a photodiode that records the light received at one point in the scene that is being recorded. To capture an image, each pixel is reset prior to the scene being imaged onto the sensor. After a predetermined exposure time, the charge stored by each photodiode is readout to provide an image of the scene.

In a conventional camera, the exposure is controlled by a shutter that is triggered in response to the user pushing a button. The image sensor is reset just before the shutter opens and is readout at a predetermined time after the shutter closes. These operations are synchronized to the user pushing the button.

In some applications, the imaging array must determine when the exposure begins and ends without the aid of a synchronization signal such as the user pushing a button. For example, there has been considerable interest in replacing x-ray film images used in dentistry with digital images generated by CMOS image sensors. In these systems, the film that is placed in the patient's mouth is replaced by a CMOS imaging array that is covered with a layer of scintillation material that converts the x-rays to visible light that can be detected by the image sensor. Conventional x-ray systems using film do not require that the film exposure be synchronized with the x-ray source, since the x-ray pulse determines the exposure. Hence, conventional x-ray systems lack a synchronization system that can be used by the solid state image sensor.

It should be noted that the film does not accumulate a significant background exposure either before or after the film is exposed to the x-rays, since the film is in a light-tight cover. CMOS sensors, in contrast, exhibit a significant "dark current" that results in a low level of charge being accumulated on the pixel in the dark. This background increases the exposure needed to provide a dental x-ray if the background is not eliminated. Accordingly, the image sensor must be reset as close to the beginning of the x-ray pulse as possible to minimize the dark current background that accumulates before the image is formed. In addition, it is advantageous to detect the end of the exposure and trigger the readout as close to the end of the x-ray as possible to minimize the dark current background that accumulates after the exposure.

A number of systems have been proposed to deal with the synchronization of the imaging sensor with the x-ray pulse. The most straightforward approach would be to provide a synchronization signal similar to the pushbutton on a conventional camera. The imaging array could then be reset and the x-ray source triggered in the proper time sequence to minimize the exposure to the patient. Unfortunately, this strategy requires that the existing millions of x-ray machines already in place in dental facilities be modified at a considerable cost. Hence, some other form of triggering system has been sought.

In one class of triggering system, a separate set of detectors is used to detect the beginning of the x-ray exposure and trigger the reset, image acquisition, and readout when x-rays are detected. These additional detectors typically include additional photodiodes that are placed around the image sensor and are monitored to determine the start of the exposure. This type of system has three problems. First, the area of the separate sensors is relatively small, and hence, the sensitivity of the detection is less than ideal. In essence, the exposure sensors are equivalent to a few extra pixels in the image plane. The position of these sensors is behind the teeth or jaw bone, and hence, these sensors accumulate charge at a rate similar to that of the image during the image exposure. Hence, the detection time for the start of the exposure can be a significant fraction of the image exposure time. The x-ray exposure during this detection time is wasted, and hence, the x-ray dose to which the patient is exposed is longer than necessary.

Second, the sensors do not sample the entire image, and hence, the triggering decision is made on data that is not necessarily representative of the image. Third, to detect the end of the exposure, these detectors must be continually read out without interfering with the accumulation of the image by the sensors in the imaging array. Hence, the sensors are often separate from the array. Providing a separate set of sensors with each imaging array increases the cost of the imaging system.

In another class of prior art system, the imaging array is continually cycled. During each cycle, the imaging array is reset, allowed to accumulate charge for a predetermined period of time and then readout. If the image that is readout indicates the accumulation of a significant charge above that expected from the dark current, the system assumes that the exposure has begun, and the array is reset and allowed to accumulate the final image. The end of the exposure is set by a timer, rather than by detecting the end of the x-ray pulse in this type of system. Hence, there is some additional dark current accumulation after the x-ray pulse is turned off. This system has a better signal-to-noise ratio than systems based on a few small sensors, since the charge from a more representative set of photodiodes in the actual image is added together to make the triggering decision. Unfortunately, this system has high power consumption due to the repeated readout cycles. The high power consumption is particularly problematic in applications that rely on battery power. In addition, the detection time is increased by the time needed to readout each image during the detection phase. Finally, this system does not detect the end of the x-ray exposure.

SUMMARY OF THE INVENTION

The present invention includes a camera for recording an image. The camera includes an array of pixel sensors, CMOS circuitry that is separate from the array of pixel sensors, a guard region, and a current detector. The guard region separates the CMOS circuitry from the array of pixel sensors. The guard region is positioned such that the guard region is exposed to light when the array of pixel sensors is exposed to light. The current detector measures the current flowing from the guard region to a power rail when the guard region is biased to a predetermined potential and generates a start trigger signal when the current exceeds a threshold value. In one aspect of the invention, a controller resets the pixel sensors in response to the start trigger signal. The guard region may include a region within the array of pixel sensors. In another aspect of the invention, the controller causes the pixel sensors to be readout when the current changes from a value over the threshold value to a value less than the threshold value. The guard region includes an implant region of a first semiconductor type in a region of the opposite semiconductor type.

DETAILED DESCRIPTION OF THE PREFERRED EMBODIMENTS OF THE INVENTION

Figure 1:
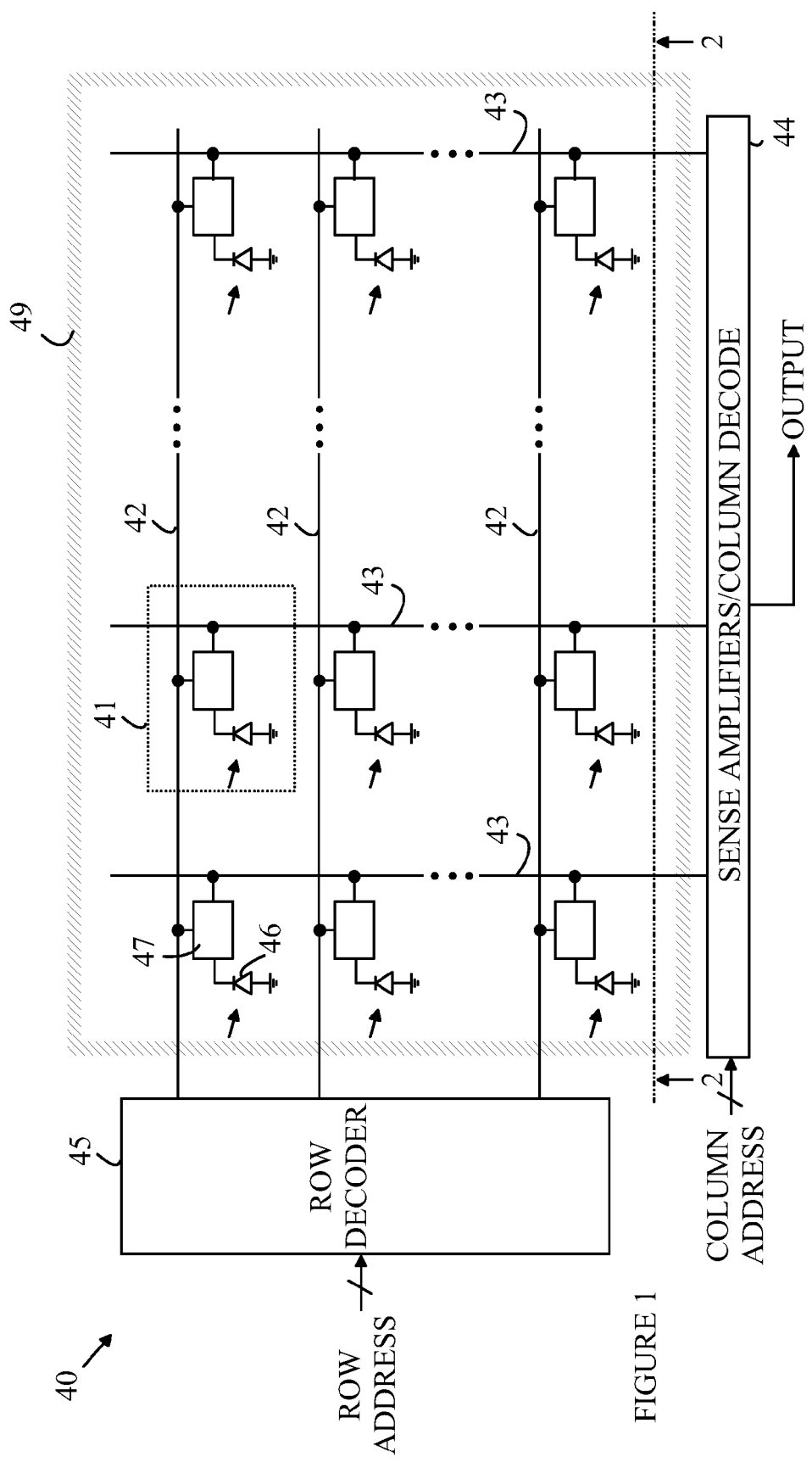
FIG. 1 is a schematic view of the top surface of a die containing imaging array 40.
Figure 2:
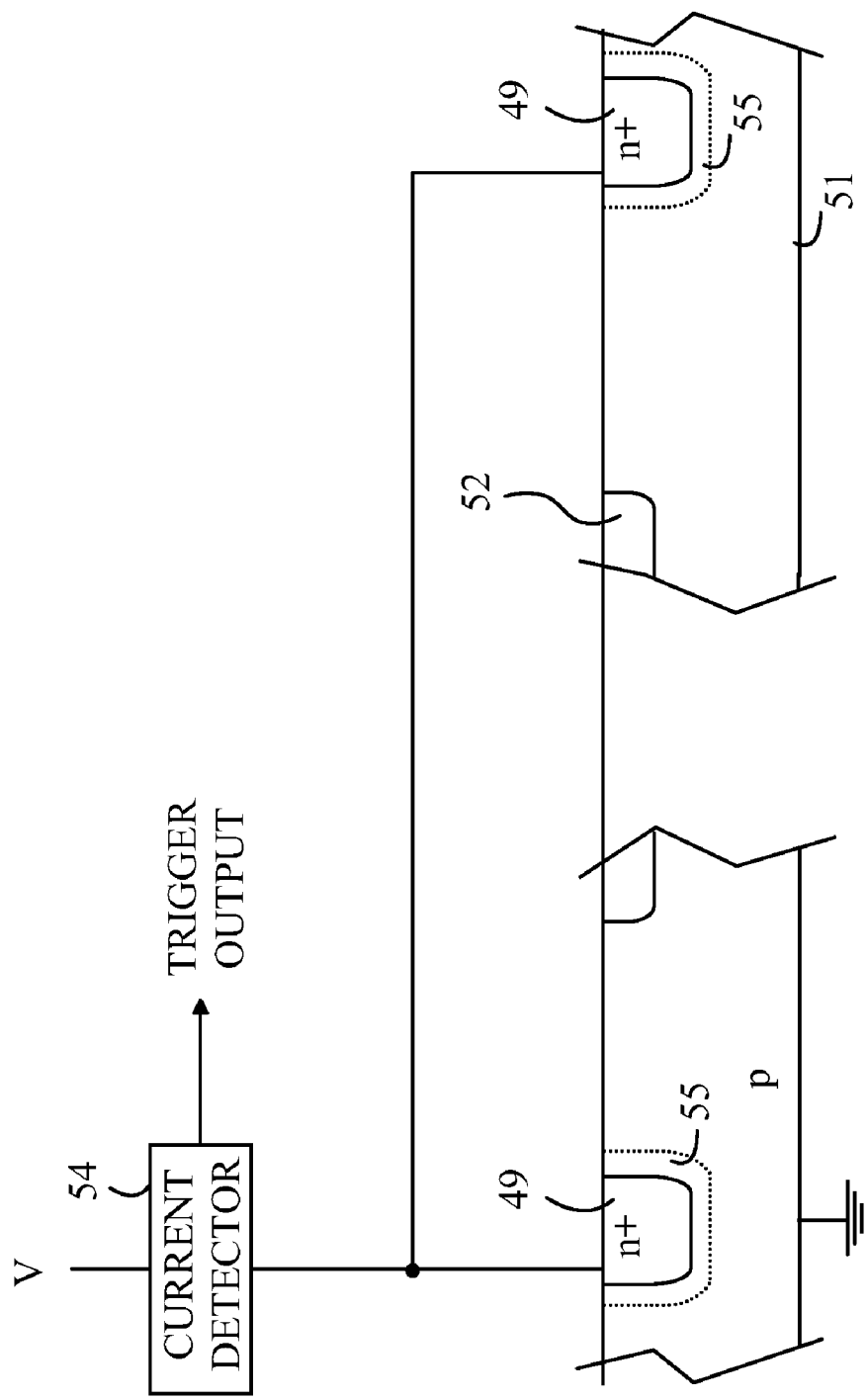
FIG. 2 is a cross-sectional view through line 2-2 shown in FIG. 1.

The manner in which the present invention provides its advantages can be more easily understood with reference to FIGS. 1 and 2, which illustrate a CMOS imaging array according to one embodiment of the present invention. FIG. 1 is a schematic view of the top surface of a die containing imaging array 40, and FIG. 2 is a cross-sectional view through line 2-2 shown in FIG. 1. Imaging array 40 is constructed from a rectangular array of pixel sensors 41. Each pixel sensor includes a photodiode 46 and an interface circuit 47. The details of the interface circuit depend on the particular pixel design. However, all of the pixel sensors include a gate that is connected to a row line 42. The gate is used to connect that pixel sensor to a corresponding bit line 43. In addition, most pixel sensors include a charge to voltage converting circuit that converts the charge stored by the photodiode during the image exposure to a voltage that is readout through the gate. The photodiodes accumulate charge when the photodiodes are exposed to light.

Prior to exposing the photodiodes to light, the photodiodes are reset by connecting the photodiodes to a reset line that is held at a potential that causes any charge stored on the photodiodes to be removed. After the photodiodes are reset, an image is projected onto imaging array 40 for a period of time sufficient to allow each photodiode to accumulate charge representative of the light that was received by that photodiode. After the exposure is completed, the charge on each photodiode is readout. The readout is normally performed one row at a time. The specific row that is enabled at any time is determined by a row address that is input to a row decoder 45. The row select lines are a parallel array of conductors that run horizontally in the metal layers over the substrate in which the photodiodes and interface circuitry are constructed.

The various bit lines terminate in a column processing circuit 44 that typically includes sense amplifiers and column decoders. The bit lines are a parallel array of conductors that run vertically in the metal layers over the substrate in which the photodiode and interface circuitry are constructed. Each sense amplifier reads the signal produced by the pixel that is currently connected to the bit line processed by that sense amplifier. The sense amplifiers may generate a digital output signal by utilizing an analog-to-digital converter (ADC). At any given time, a single pixel sensor is readout from the imaging array. The specific column that is readout is determined by a column address that is utilized by a column decoder to connect the sense amplifier/ADC output from that column to circuitry that is external to the imaging array.

The CMOS decode circuitry contributes to the dark current associated with the imaging array. Some of the electrons that would normally travel between the source and drain of the CMOS transistors in this circuitry when the transistors are switched on escape into the substrate and drift into the portion of the array in which the photodiodes are located. These electrons are captured by the photodiodes and contribute to the dark current. To reduce the dark current generated by such drifting electrons, the imaging array is typically surrounded by guard region 49 that collects the electrons, and hence, prevents the drifting electrons from reaching the photodiodes.

For the purposes of this discussion, a guard region will be defined to be an implant region that separates active CMOS circuitry from the circuitry in the pixel array itself, i.e., the photodiodes and interface circuits 47, and which is biased to provide a depletion region adjacent to the implant that collects free electrons generated by the active CMOS circuitry when the implant region is biased.

Refer now to FIG. 2. Imaging array 40 is constructed on a p-type region 51. The portion of the pixel array that includes the photodiodes and the active circuitry associated with each photodiode is shown at 52. Pixel array 52 is surrounded by a guard region 49 that includes a deep n+ implanted area that creates a depletion region 55 when the region is biased. The depletion region collects any free electrons that wander into the region, and hence, electrons that would otherwise drift from the region outside the imaging array into the imaging array are intercepted, and hence, prevented from reaching the photodiodes. The depth of the guard region implant is typically 1 μm from the top surface, whereas the depth of the implants for the photodiodes in pixel array 52 and active CMOS circuitry are typically 0.5 μm from the top surface. The added depth assures that the electrons that are generated by active circuitry and drift downward laterally are intercepted by the guard region.

The present invention is based on the observation that the guard region also acts as photodiodes that collect photoelectrons generated in the vicinity of the guard regions by the interaction of light or x-rays with the silicon in the guard region areas. In prior art devices, the photocurrent generated by this interaction is shunted to the power rails. The present invention utilizes the guard region as an exposure detector by measuring this current.

The effective area of this guard region photodiode is large compared to the area of an individual photodiode within the imaging array, and hence, the problems associated with triggering schemes that utilize a few photodiodes to detect the beginning of the exposure are substantially reduced in the present invention. Typically, the guard region has an area that is of the order of 10,000 times the area of a single photodiode. In addition, the guard region current can be measured without reading out the imaging array and incurring the time delays and power expenditures associated with such a readout operation. Imaging array 40 uses the collected current from the guard region to generate a trigger signal that can be used to detect the beginning and end of the exposure. The current is measured by a current detector 54 that generates a trigger output signal that is related to the current flowing from the guard region to the power rail used to bias the guard region. Hence, by adding a current detector to the design of an imaging array that utilizes a guard region, a trigger signal can be provided at very little additional cost.

While the guard regions provide a large area monitoring photodiode function, the area of the image sampled is the area around the periphery of the imaging array, and hence, may not be representative of the image being captured. For many applications this is not a problem. However, if a more representative monitoring array is required, a similar photodiode structure could be introduced into the imaging array area.

Figure 3:
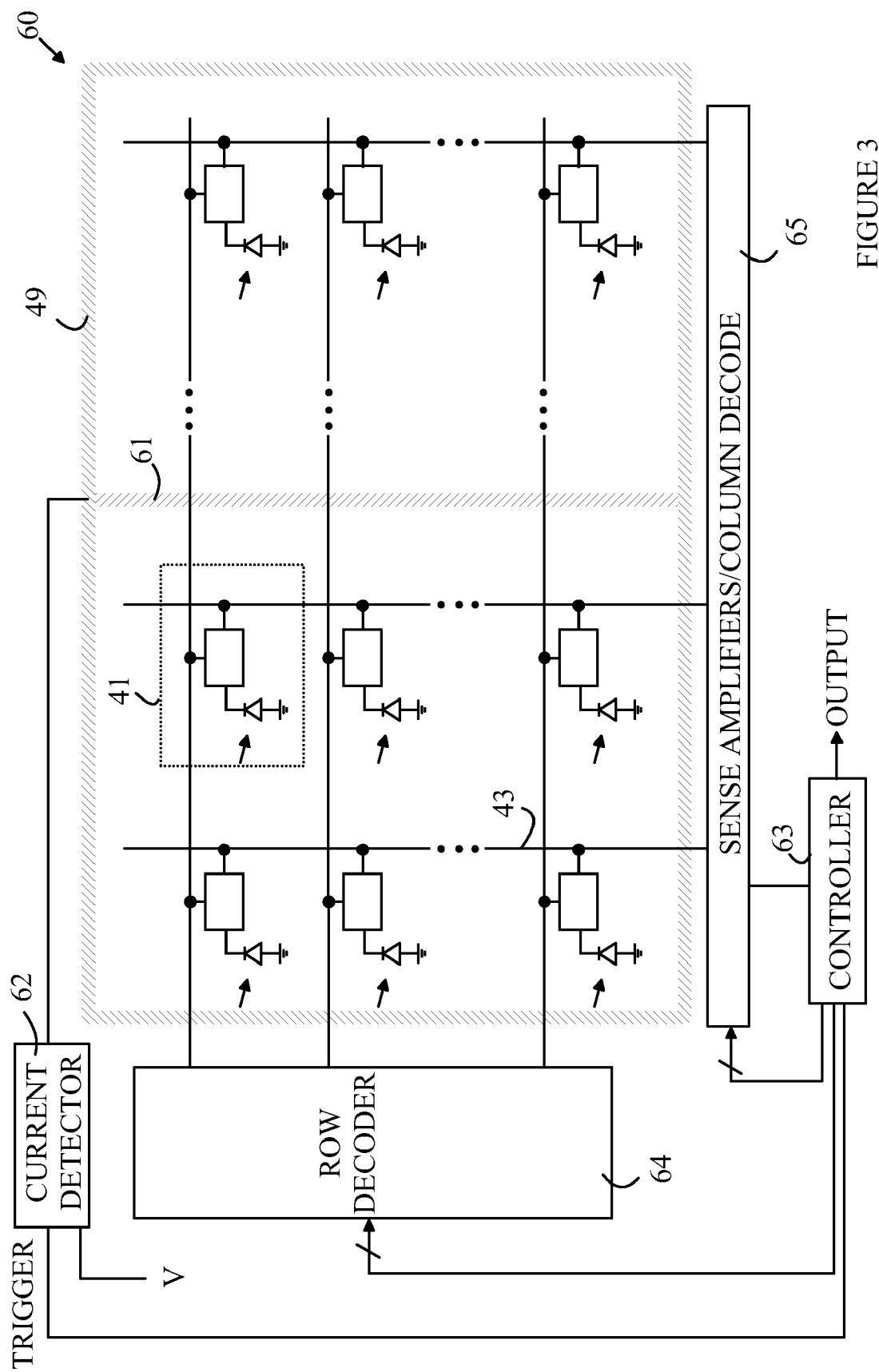
FIG. 3 illustrates another embodiment of a camera according to the present invention.

Refer now to FIG. 3, which illustrates another embodiment of a camera according to the present invention. Camera 60 includes an imaging array that operates in a manner analogous to that discussed above with reference to FIGS. 1 and 2. Camera 60 includes a guard region 49 that surrounds the pixels 41 in the imaging array. In addition, a guard region extension 61 is provided through the imaging array and is connected to guard region 49. Guard region extension 61 samples the light at locations internal to the imaging array.

The current generated by guard regions 49 and 61 is measured by the current detector 62 that also biases the guard regions. Current detector 62 generates a trigger signal that is used by controller 63 to start the image accumulation function and, optionally, the readout function of camera 60. Controller 63 also controls the sense amplifiers row decode circuitry 64, and column decode circuitry 65 used to digitize the final image.

Figure 4:
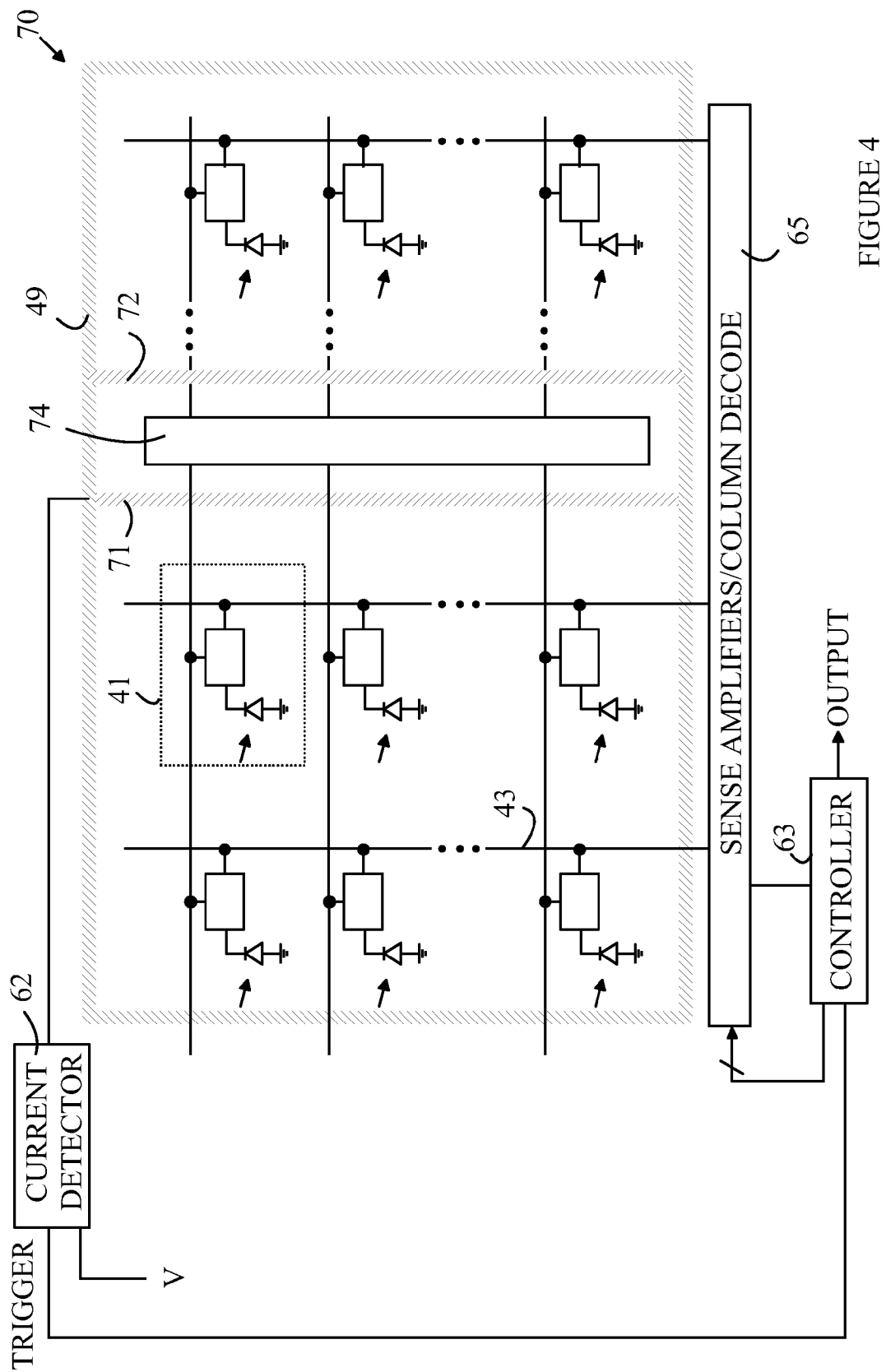
FIG. 4 illustrates a camera in which the row decoding circuitry is located within the pixel array.

In some embodiments of the present invention, the row and/or column decoding circuitry is moved to positions within the pixel array to provide an arrangement in which corners of the dies can be cut to provide an imaging array that is better suited for insertion into a patient's mouth. A camera that utilizes this configuration is disclosed in co-pending U.S. patent application Ser. No. 11/494,058, filed Jul. 26, 2007, which is hereby incorporated by reference. Refer now to FIG. 4, which illustrates a camera in which the row decoding circuitry is located within the pixel array. Camera 70 operates in a manner analogous to camera 60. However, in camera 70, the row decoder 74 is located within the body of the pixel array. In this case, it is advantageous to include guard regions 71 and 72 on each side of row decoder 74 to collect free electrons generated by the active circuitry within row decoder 74. These guard regions can also be connected to the outer guard region 49 or directly to current detector 62 so that the current generated in those guard regions can be utilized to provide an exposure meter.

Various modifications to the present invention will become apparent to those skilled in the art from the foregoing description and accompanying drawings. Accordingly, the present invention is to be limited solely by the scope of the following claims.

What is claimed is:

1. A device comprising:
an array of pixel sensors;
CMOS circuitry separate from said array of pixel sensors;
a guard region separating said CMOS circuitry from said array of pixel sensors, said guard region being positioned such that said guard region is exposed to light when said array of pixel sensors is exposed to light; and
a current detector that measures the current flowing from said guard region to a power rail when said guard region is biased to a predetermined potential and generates a start trigger signal when said current exceeds a threshold value.

2. The device of claim 1 further comprising a controller that resets said pixel sensors in response to said start trigger signal.

3. The device of claim 1 wherein said guard region comprises a region within said array of pixel sensors.

4. The device of claim 1 wherein said controller causes said pixel sensors to be readout when said current changes from a value over said threshold value to a value less than said threshold value.

5. The device of claim 1 wherein each pixel sensor comprises an implant region having a first area and said guard region comprises an implant region having a second area, said second area being greater than 1000 times said first area.

6. The device of claim 1 wherein said guard region comprises an implant region of a first semiconductor type in a region of the opposite semiconductor type.

7. A method for triggering an imaging array comprising an array of pixel sensors and CMOS circuitry separate from said array of pixel sensors, said method comprising:
providing a guard region separating said CMOS circuitry from said array of pixel sensors, said guard region being positioned such that said guard region is exposed to light when said array of pixel sensors is exposed to light;
measuring the current flowing from said guard region to a power rail when said guard region is biased to a predetermined potential; and
generating a start trigger signal when said current exceeds a threshold value.

8. The method of claim 7 further comprising resetting said pixel sensors in response to said start trigger signal.

9. The method of claim 7 further comprising causing said pixel sensors to be readout when said current changes from a value over said threshold value to a value less than said threshold value.

\* \* \* \* \*